United States Patent
Hu et al.

(10) Patent No.: US 8,088,647 B2
(45) Date of Patent: Jan. 3, 2012

(54) BUMPING FREE FLIP CHIP PROCESS

(75) Inventors: Kunzhong (Kevin) Hu, Irvine, CA (US); Edward Law, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 62 days.

(21) Appl. No.: 12/783,855

(22) Filed: May 20, 2010

(65) Prior Publication Data

US 2011/0115075 A1 May 19, 2011

Related U.S. Application Data

(60) Provisional application No. 61/261,801, filed on Nov. 17, 2009.

(51) Int. Cl.
*H01L 21/44* (2006.01)
*H01L 21/48* (2006.01)
*H01L 21/50* (2006.01)
*H01L 21/00* (2006.01)

(52) U.S. Cl. ............. 438/108; 438/25; 438/26; 438/51; 438/106; 438/107; 257/E21.499; 257/E21.5; 257/E21.508; 257/E21.511; 257/E21.513

(58) Field of Classification Search ........... 257/E21.499, 257/E21.5, E21.508, E21.511, E21.513
See application file for complete search history.

(56) References Cited

U.S. PATENT DOCUMENTS

| | | | |
|---|---|---|---|
| 7,087,991 B2 * | 8/2006 | Chen et al. ................ | 257/700 |
| 2004/0173915 A1 * | 9/2004 | Lee ............................ | 257/780 |
| 2006/0097398 A1 * | 5/2006 | Zeng ......................... | 257/772 |
| 2006/0237828 A1 * | 10/2006 | Robinson et al. ........... | 257/678 |
| 2008/0026559 A1 * | 1/2008 | Miyazaki ................... | 438/614 |

* cited by examiner

*Primary Examiner* — Mohsen Ahmadi
(74) *Attorney, Agent, or Firm* — Fiala & Weaver P.L.L.C.

(57) ABSTRACT

Methods, systems, and apparatuses for an integrated circuit package assembly process are provided. A wafer is received having a surface defined by a plurality of integrated circuit regions. Electrical conductors are accessible through corresponding first openings in a first passivation layer on the surface of the wafer. Solderable metal layer features are formed on the electrical conductors through the first openings. The wafer is singulated to form a plurality of flip chip dies. A plurality of package substrates is received. Each package substrate has a plurality of solder on pad (SOP) features on a respective surface. Each flip chip die is mounted to a corresponding package substrate such that each SOP feature is coupled to a corresponding solderable metal layer feature, to form a plurality of integrated circuit packages.

8 Claims, 9 Drawing Sheets

2000

2002
receive an integrated circuit die, a surface of the an integrated circuit die having a passivation layer formed thereon such that a portion of each of a plurality of electrical conductors is accessible through a corresponding opening of a plurality of openings in the passivation layer 2004
form a plurality of solderable metal layer features on the plurality of electrical conductors through the openings such that each solderable metal layer feature is formed on the accessible portion of a respective electrical conductor of the plurality of electrical conductors 2006
mount the integrated circuit die to a package substrate such that each SOP feature of a plurality of solder on pad (SOP) features on a surface of the package substrate is coupled to a corresponding solderable metal layer feature

FIG. 20

BUMPING FREE FLIP CHIP PROCESS

This application claims the benefit of U.S. Provisional Application No. 61/261,801, filed on Nov. 17, 2009, which is incorporated by reference herein in its entirety.

BACKGROUND OF THE INVENTION

1. Field of the Invention

The present invention relates to integrated circuit packaging technology.

2. Background Art

Integrated circuit (IC) chips or dies are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

In some BGA packages, a die is attached to the substrate of the package (e.g., using an adhesive), and signals of the die are interfaced with electrical features (e.g., bond fingers) of the substrate using wire bonds. In such a BGA package, wire bonds are connected between signal pads/terminals of the die and electrical features of the substrate. In another type of BGA package, which may be referred to as a "flip chip package," a die may be attached to the substrate of the package in a "flip chip" orientation. In such a BGA package, solder bumps are formed on the signal pads/terminals of the die, and the die is inverted ("flipped") and attached to the substrate by reflowing the solder bumps so that they attach to corresponding pads on the surface of the substrate.

Conventional techniques for assembling flip chip packages are expensive, use a relatively large number of assembly steps, and may be performed using various assembly facilities. As such, flip chip package assembly techniques that are less costly, use fewer process steps, and/or use fewer assembly facilities are desired.

BRIEF SUMMARY OF THE INVENTION

Methods, systems, and apparatuses are described for making flip chip integrated circuit packages without wafer bumping substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 20 shows a flowchart providing an example process for assembling an integrated circuit package, according to an embodiment.

Figure 1:
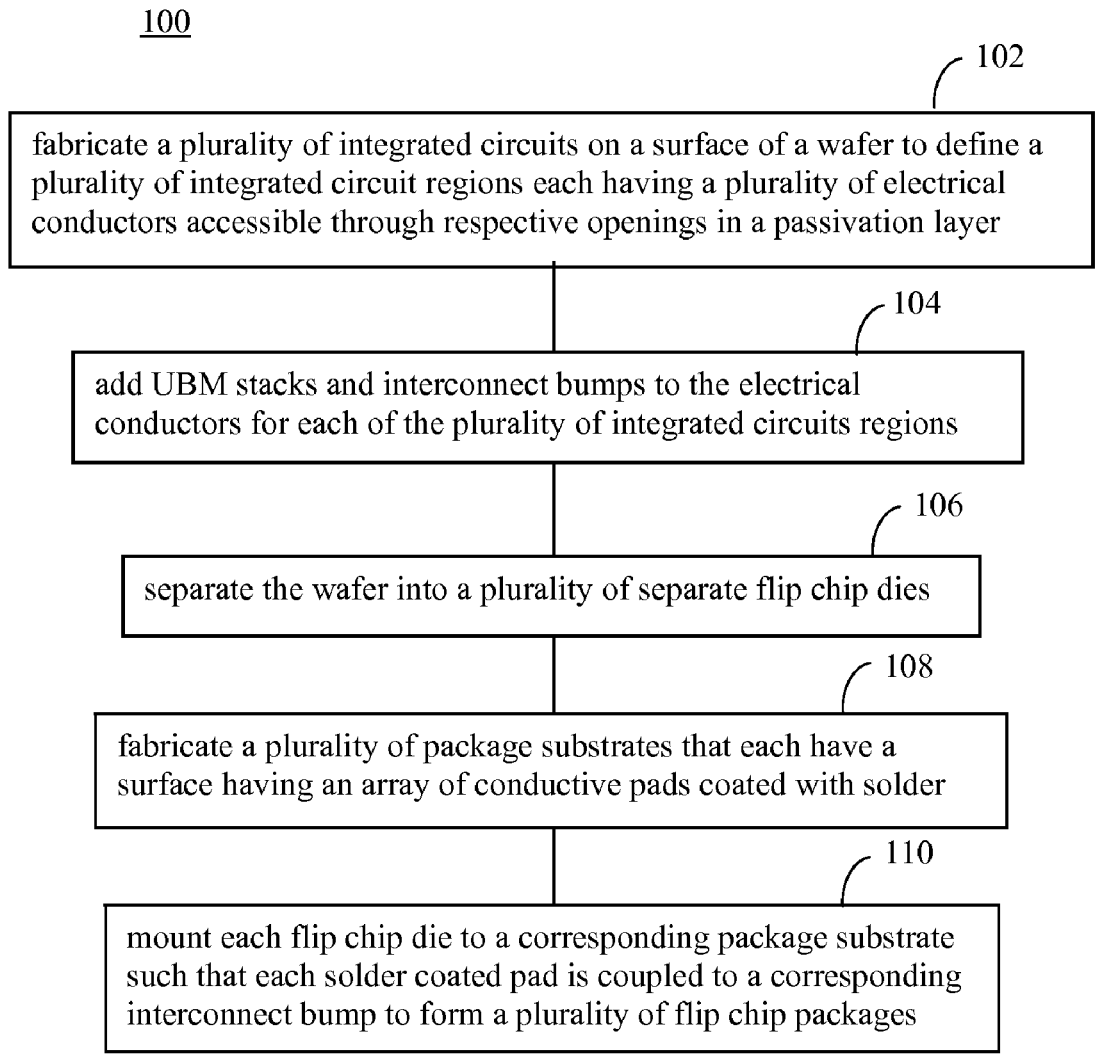
FIG. 1 shows a flowchart providing an example process for fabricating flip chip integrated circuit packages.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Examples of Flip Chip Package Assembly

Figure 2:
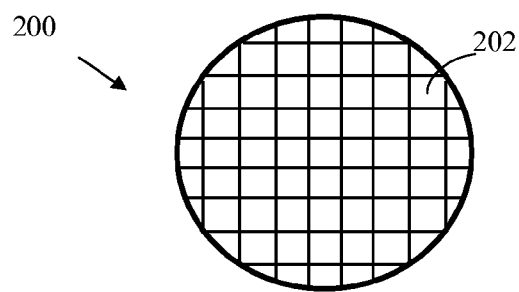
FIG. 2 shows a plan view of an example wafer.

Flip chip packages may be assembled in various ways. For instance, FIG. 1 shows a flowchart 100 providing an example process for assembling flip chip integrated circuit packages. Flowchart 100 begins with step 102. In step 102, a plurality of integrated circuits is fabricated on a surface of a wafer to define a plurality of integrated circuit regions each having a plurality of electrical conductors accessible through respective openings in a passivation layer. For example, FIG. 2 shows a plan view of a wafer 200. Wafer 200 may be silicon, gallium arsenide, or other wafer type. As shown in FIG. 2, wafer 200 has a surface 202 defined by a plurality of integrated circuit regions (shown as small rectangles in FIG. 2). Each integrated circuit region is configured to be packaged separately into a separate flip chip package according to the process of flowchart 100.

Figure 3:
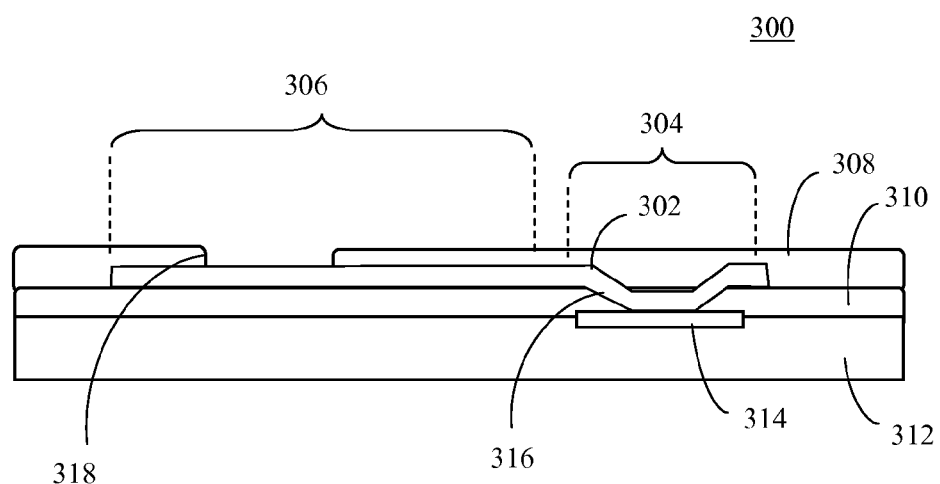
FIG. 3 shows a portion of a wafer in which an electrical conductor is formed on a surface of the wafer in an integrated circuit region.

Various types of electrical conductors may be formed in wafer 200. For instance, FIG. 3 shows a cross-sectional view of a portion 300 of a wafer (e.g., wafer 200) in which an electrical conductor 302 (also known as a "routing interconnect" or "redistribution interconnect") is formed on a surface of the wafer in an integrated circuit region. As shown in FIG. 3, portion 300 includes electrical conductor 302, a first passivation layer 308, a second passivation layer 310, a wafer substrate 312, and a terminal 314. Terminal 314 is a signal pad (e.g., an I/O pad) of the integrated circuit region (any number of terminals 314 may be present in an integrated circuit region). Second passivation layer 310 is formed on wafer substrate 312 over terminal 314. Vias are formed through second passivation layer 310 at the locations of terminals 314, including forming an opening 316 through second passivation layer 310 over terminal 314. An electrically conductive material (e.g., a metal or combination of metals/alloy) is formed on second passivation layer 310. One or more electrical conductors, such as electrical conductor 302 of FIG. 3, are formed in the metal layer. For instance, as shown in FIG. 3, electrical conductor 302 is formed to have a first portion 304 in contact with terminal 314 though opening 316, and to have a second portion 306 that extends over second passivation layer 310. First passivation layer 308 is formed over second passivation layer 310 and one or more electrical conductors 302. A second set of vias is formed through first passivation layer 308, including forming an opening 318 through first passivation layer 308 over second portion 306 of electrical conductor 302. Opening 318 provides access to second portion 306 of electrical conductor 302.

Referring back to FIG. 1, in step 104, UBM stacks and interconnect bumps are added to the electrical conductors for each of the plurality of integrated circuits regions. After wafer 200 is produced, bump interconnects are added to each of the electrical conductors that are accessible in each of the integrated circuit regions. The process for adding bump interconnects includes adding an under bump metallization (UBM) layer/stack for each bump interconnect, and attaching a bump interconnect to the UBM layer/stack. UBM layers/stacks enable bump interconnects to adhere to the flip chip die, among other benefits.

Figure 4:
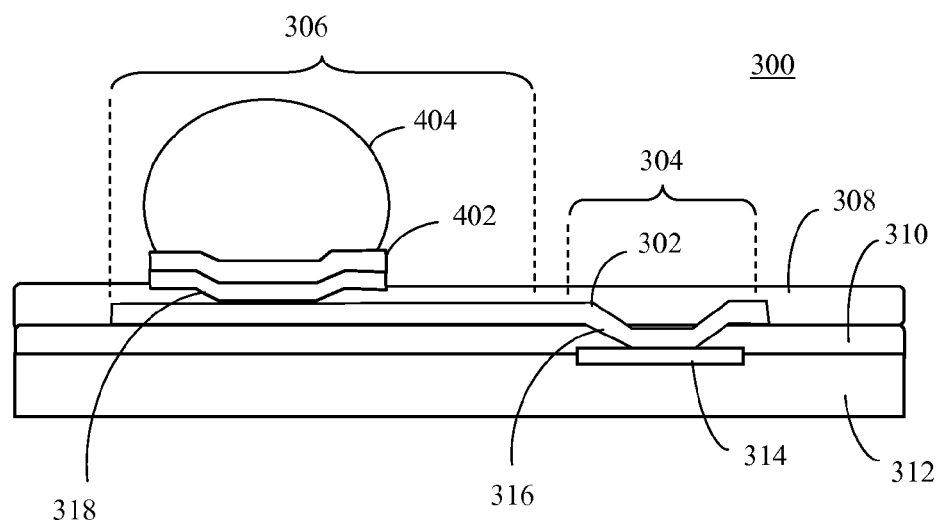
FIG. 4 shows the portion of the wafer of FIG. 3, with a UBM stack and bump interconnect formed on the electrical conductor.

For example, FIG. 4 shows wafer portion 300 of FIG. 3 in which a UBM stack 402 is formed on second portion 306 of electrical conductor 302, and a bump interconnect 404 is formed on UBM stack 402. UBM stack 402 includes a plurality of UBM layers that are applied in sequence to form a stack. For example, UBM layers may be applied using one or more metal deposition processes, such as a plating process, a sputtering process, etc. UBM stack 402 provides a robust interface between electrical conductor 302 and a package interconnect mechanism, such as bump interconnect 404. UBM stack 402 serves as a solderable layer for bump interconnect 404. Furthermore, UBM stack 402 provides protection for underlying metal or circuitry (e.g., electrical conductor 302 and/or terminal 314) from chemical/thermal/electrical interactions between the various metals/alloys used for the underlying metal or circuitry. Bump interconnect 404 may be solder, other metal, combination of metals/alloy, etc., and may be applied in any suitable manner, including by sputtering, plating, ball placement, etc. Bump interconnects 404 are used to interface the corresponding die/chip resulting from the particular integrated circuit region with a corresponding package substrate. Bump interconnects 404 may be solder, other metal, combination of metals/alloy, etc.

Figure 5:
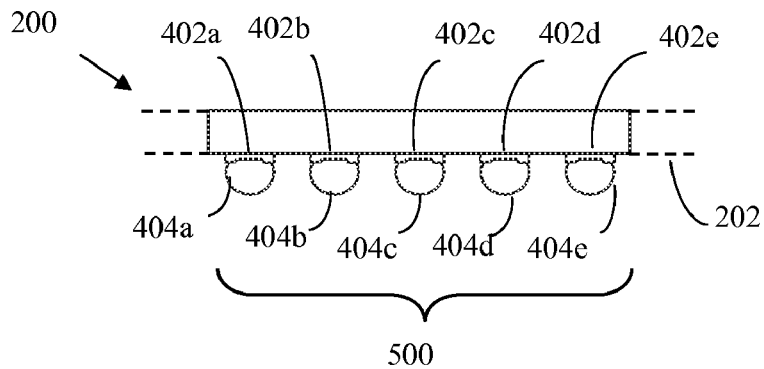
FIG. 5 shows a cross-sectional side view of a wafer that includes an integrated circuit region.
Figure 6:
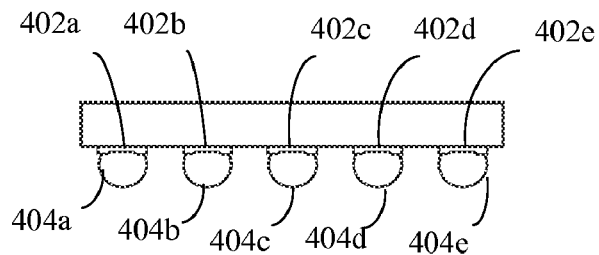
FIG. 6 shows a flip chip die corresponding to the integrated circuit region of FIG. 5 resulting from the singulation of the wafer into a plurality of flip chip dies.

In step 106, the wafer is separated into a plurality of separate flip chip dies. For instance, FIG. 5 shows a cross-sectional side view of wafer 200, highlighting an integrated circuit region 500. As shown in FIG. 5, integrated circuit region 500 has a plurality of bump interconnects 404a-404e attached to surface 202 of wafer 200 by corresponding UBM stacks 402a-402e. Wafer 200 may be singulated (separated) into a plurality of integrated circuit packages corresponding to the integrated circuit regions formed therein. For instance, FIG. 6 shows a flip chip die 600 corresponding to integrated circuit region 500 resulting from the singulation of wafer 200 into a plurality of flip chip dies.

Figure 7:
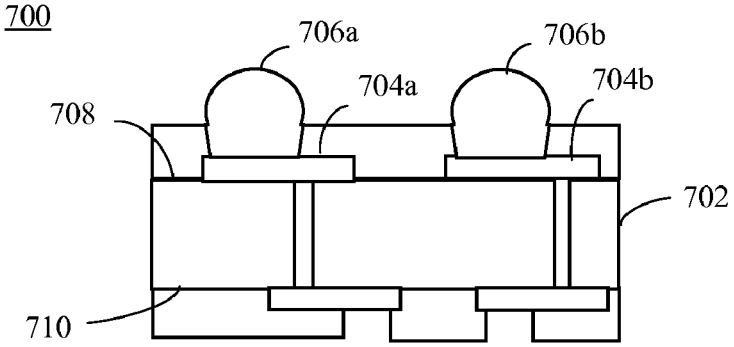
FIG. 7 shows a portion of a package substrate.

In step 108, a plurality of package substrates is fabricated, each package substrate having a surface having an array of conductive pads coated with solder. For example, FIG. 7 shows a portion of a package substrate 700. As shown in FIG. 7, package substrate 700 includes a base substrate layer 702 that has a first (e.g., top) surface 708 that is opposed to a second (e.g., bottom) surface 710 of a base substrate layer 702. Substrate 700 may include one or more electrically conductive layers that are separated by one or more electrically insulating layers. An electrically conductive layer may include traces/routing, bond fingers, contact pads, and/or other electrically conductive features. For example, substrates having two electrically conductive layers or four electrically conductive layers are common. The electrically conductive layers may be made from an electrically conductive material, such as a metal or combination of metals/alloy, including copper, aluminum, tin, nickel, gold, silver, etc. The electrically insulating layer(s) may be made from ceramic, plastic, and/or other suitable materials. For example, the electrically insulating layer(s) of substrate 104 may be made from an organic material such as BT (bismaleimide triazine) laminate/resin, a flexible tape material such as polyimide, a flame retardant fiberglass composite substrate board material (e.g., FR-4), etc. The electrically conductive and non-conductive layers can be stacked and laminated together, or otherwise attached to each other, to form substrate 700, in a manner as would be known to persons skilled in the relevant art(s).

In the example of FIG. 7, base substrate layer 702 has a first electrically conductive layer on surface 708 and a second electrically conductive layer on surface 710. The first electrically conductive layer includes a plurality of conductive features (e.g., signal pads), including conductive features 704a and 704b. Furthermore, solder on pad (SOP) features 706a and 706b are formed on conductive features 704a and 704b, respectively. Solder on pad features 706a and 706b are solder finishes that are applied to conductive features 704a and 704b, such as by stencil printing (e.g., solder paste stencil printing) or plating, as would be known to persons skilled in the relevant art(s).

Figure 8:
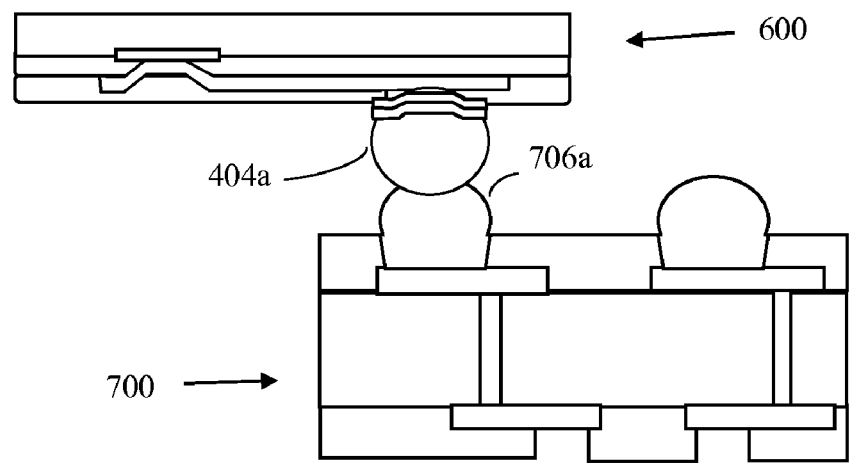
FIG. 8 shows a portion of a flip chip die being mounted to the package substrate partially shown in FIG. 7.

In step 110, each flip chip die is mounted to a corresponding package substrate such that each solder coated pad is coupled to a corresponding interconnect bump to form a plurality of flip chip packages. Each integrated circuit flip chip die separated from wafer 200 in step 106 may be mounted to a corresponding package substrate to form a corresponding flip chip package. For instance, FIG. 8 shows a portion of flip chip die 600 (FIG. 6) being mounted to the portion of package substrate 700 visible in FIG. 7. As shown in FIG. 8, each bump interconnect 404 of flip chip die 600 is positioned in contact with a corresponding SOP feature 706 of package substrate 700 (e.g., bump interconnect 404a is shown in contact with SOP feature 70ba). The bump interconnects 404 and SOP features 706 may be reflowed or otherwise processed to cause the contacting bump interconnect 404/SOP feature 706 pairs to melt and solidify together to form a solder bond or joint. An array of such solder bonds/joints are formed to attach flip chip die 600 to package substrate 700, and to interface the signals of flip chip die 600 with corresponding routing in package substrate 700.

Figure 9:
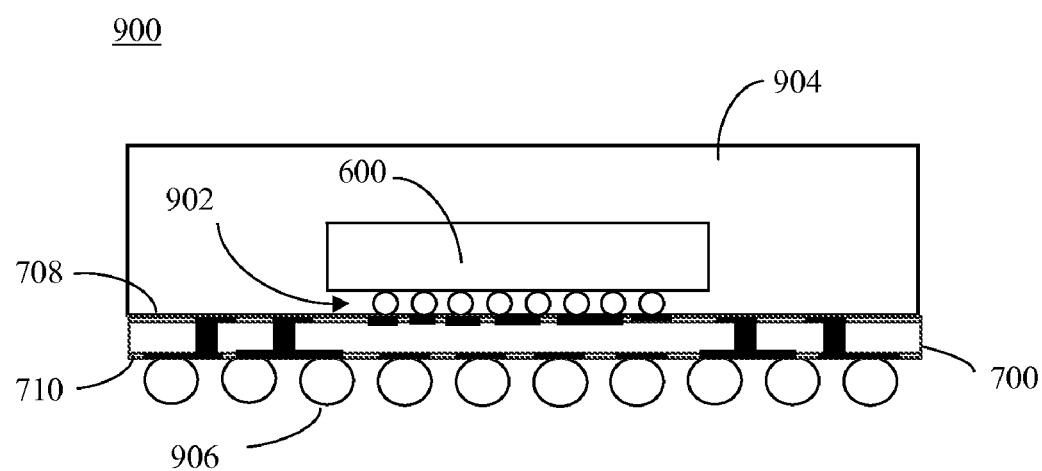
FIG. 9 shows a side view of a flip chip package formed by mounting the flip chip die of FIG. 6 to the package substrate of FIG. 7.

For example, FIG. 9 shows a side view of a flip chip package 900 formed by mounting flip chip die 600 to package substrate 700. As shown in FIG. 9, an array 902 of solder bonds/joints formed by connected bump interconnects 404 and SOP features 706 attaches flip chip die 600 to package substrate 700. Note that further processing may be performed to assemble package 900, including applying an encapsulating material 904 that encapsulates flip chip die 600 on package substrate 700, attaching solder balls 906 to surface 710, etc.

Flip chip packages similar to flip chip package 900 are becoming more and more popular. Flip chip packages are smaller and thinner IC packages that can provide improved performance and lower costs relatively to other types of IC packages.

Figure 10:
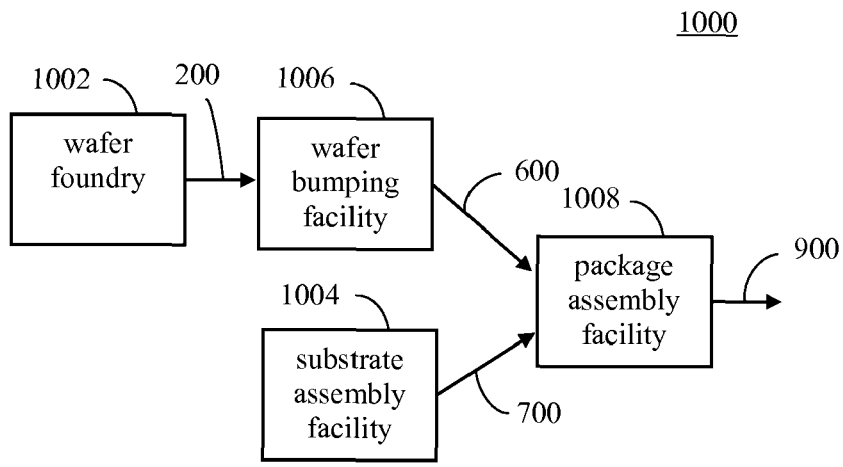
FIG. 10 shows a block diagram of an example flip chip package assembly system.

However, flowchart 100 includes a relatively large number of assembly steps, and therefore is an expensive technique for assembling flip chip packages. Typically, the steps of flowchart 100 are performed at different facilities that specialize in the corresponding processes. For instance, FIG. 10 shows a block diagram of an example flip chip package assembly system 1000. As shown in FIG. 10, system 1000 includes a wafer foundry 1002, a substrate assembly facility 1004, a wafer bumping facility 1006, and a package assembly facility 1008. Wafer fabrication according to step 102 of flowchart 100 is typically performed at wafer foundry 1002. As shown in FIG. 10, wafer foundry 1002 produces wafer 200. After wafer 200 is produced, wafer 200 is sent to wafer bumping facility 1006 to add UBM stacks and bump interconnects to wafer 200 according to step 104. Wafer bumping facility 1006 or package assembly facility 1008 singulates the bumped wafer (according to step 106) to produce a plurality of flip chip dies 600, which are received by package assembly facility 1008. A substrate supplier at substrate assembly facility 1004 produces package substrates according to step 108. As shown in FIG. 10, package assembly facility 1008 receives package substrates 700. Package assembly facility 1008 attaches received flip chip dies 600 to package substrates 700 to assemble flip chip packages 900 according to step 110.

Flowchart 100 and system 1000 each involve wafer bumping (step 104 and wafer bumping facility 1006, respectively). Wafer bumping takes time and is expensive, and adds complexity to the logistics of the overall package assembly, and thus is undesirable. The next section describes techniques for producing flip chip packages in a manner that does not use wafer bumping.

Example Embodiments for Package Assembly without Wafer Bumping

According to embodiments, techniques for forming flip chip packages are provided that eliminate the need for wafer bumping. In embodiments, solderable metal layers are added on integrated circuit electrical features rather than UBM layers and bump interconnects that would conventionally be applied (e.g., at a wafer bumping facility). Application of solderable metal layers rather than wafer bumping provides numerous advantages. For instance, such solderable metal layers may be applied at the wafer foundry after the wafer is formed so that the wafer may be transported directly to the package assembly facility, rather transporting the wafer to a separate wafer bumping facility prior to package assembly. As such, integrated circuit package assembly using solderable metal layer features is a less expensive and less complex process compared to integrated circuit package assembly that uses wafer bumping.

Figure 11:
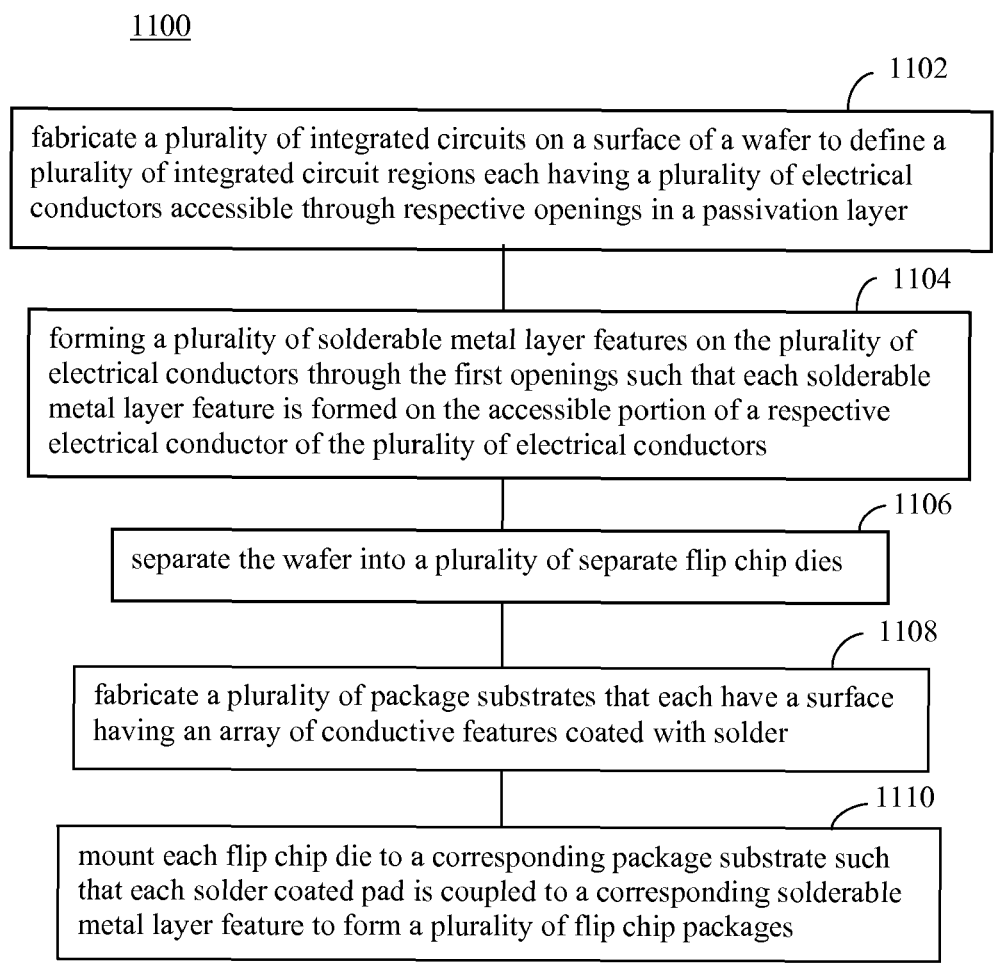
FIG. 11 shows a flowchart providing an example process for assembling integrated circuit packages, according to an embodiment.

Integrated circuit package assembly using solderable metal layer features may be performed in various ways in embodiments. For instance, FIG. 11 shows a flowchart 1100 providing an example process for assembling integrated circuit packages, according to an embodiment. Other structural and operational embodiments will be apparent to persons skilled in the relevant art(s) based on the discussion provided herein. Flowchart 1100 is described as follows.

Referring to flowchart 1100, in step 1102, a plurality of integrated circuits is fabricated on a surface of a wafer to define a plurality of integrated circuit regions each having a plurality of electrical conductors accessible through respective openings in a passivation layer. For example, as described above with respect to step 102 of flowchart 100 (FIG. 1), FIG. 2 shows a plan view of a wafer 200. As shown in FIG. 2, surface 202 of wafer 200 is defined by a plurality of integrated circuit regions (shown as small rectangles in FIG. 2). Each integrated circuit region is configured to be packaged separately into a separate flip chip package according to the process of flowchart 100.

Each integrated circuit region of wafer 200 may include one or more exposed electrical conductors (e.g., I/O terminals or pads, routing, etc.). Various types of electrical conductors may be formed in wafer 200. For instance, as described above, FIG. 3 shows wafer portion 300, which includes electrical conductor 302. As shown in FIG. 3, electrical conductor 302 is formed to have a first portion 304 in contact with terminal 314 though opening 316, and to have a second portion 306 that extends over second passivation layer 310. First passivation layer 308 is formed over second passivation layer 310 and electrical conductor 302. Opening 318 through first passivation layer 308 provides access to second portion 306 of electrical conductor 302.

Wafer substrate 312 may be made of any suitable wafer material, such as silicon or gallium arsenide. Terminal 314 is an I/O (input/output) pad for an integrated circuit chip/die included in the wafer, and thus may be electrically coupled to an internal signal of the wafer. Terminal 314 may be made of one or more metals, including a stack of layers of metals, including one or more layers of copper, aluminum, other metal(s), or combination of metals/alloy. For instance, in one common configuration, a top layer of terminal 314 that is exposed through opening 316 may be an aluminum pad (AP) layer. The AP layer may be formed on a copper layer of terminal 314.

First and second passivation layers 308 and 310 may be formed in any manner, including by deposition (e.g., by coating, etc.) of an electrically insulating material, such as silicon oxide, silicon nitride, a polymer, a glass material, etc. Openings 316 and 318 may be formed in passivation layers 308 and 310, respectively, in any manner, including by an etching process (e.g., a dry plasma etch process, a wet etching process, etc.) or other technique. Electrical conductor 302 may be formed of any suitable electrically conductive material, including a metal such as a solder or solder alloy, copper, aluminum, gold, silver, nickel, tin, titanium, a combination of metals/alloy, etc. Electrical conductor 302 may be formed in any manner, including sputtering, plating, lithographic processes, by printing electrical conductor 302 (e.g., using an ink jet printer), and/or in any manner as would be known to persons skilled in the relevant art(s). Electrically conductor 316 may be formed in any shape, including as traces/routing, as via capture pads (e.g., circular), etc.

Figure 12:
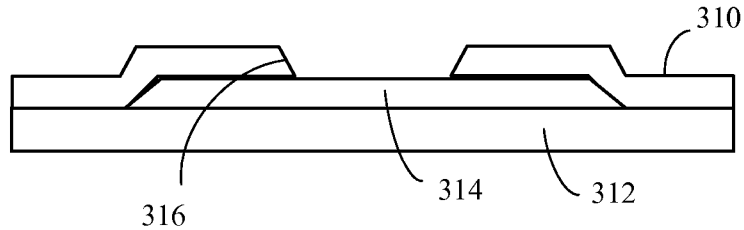
FIG. 12 shows a cross-sectional view of a portion of a wafer having an exposed terminal.

In other embodiments, a routing interconnect may not be present, and terminal 314 itself may be the electrical conductor. For instance, FIG. 12 shows a cross-sectional view of a portion 1200 of a wafer (such as wafer 200). As shown in FIG. 12, wafer portion 1200 includes passivation layer 310, wafer substrate 312, and terminal 314. Passivation layer 310 is formed on substrate 312 and terminal 314, with opening 316 formed through passivation layer 310 so that at least a portion of terminal 314 is accessible.

Figure 13:
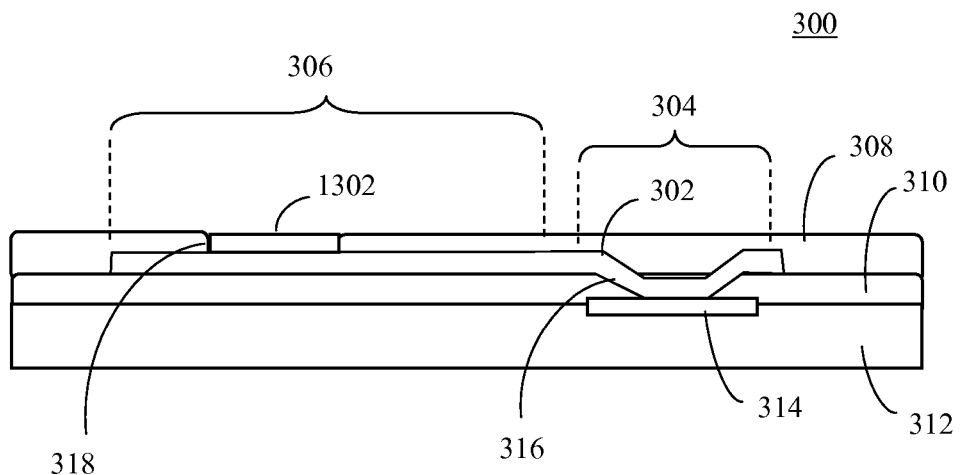
FIGS. 13 and 14 show cross-sectional views of the wafer portions of FIGS. 3 and 12 in which solderable metal layer features are formed on corresponding electrical conductors, according to example embodiments.
Figure 14:
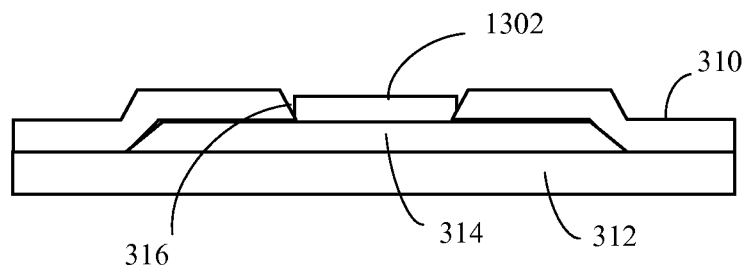

Referring back to FIG. 11, in step 1104, solderable metal layer features are formed on the plurality of electrical conductors through the first openings such that each solderable metal layer feature is formed on the accessible portion of a respective electrical conductor of the plurality of electrical conductors. For example, referring to FIG. 3, a solderable metal layer feature may be formed at opening 318 on electrical conductor 302. For instance, FIG. 13 shows wafer portion 300 (of FIG. 3) in which a solderable metal feature 1302 is formed on second portion 306 of electrical conductor 302 through opening 318, according to an example embodiment. In another example, referring to FIG. 12, a solderable metal layer feature may be formed at opening 316 on terminal 314. For instance, FIG. 14 shows wafer portion 1200 (of FIG. 12) in which solderable metal feature 1302 is formed on terminal 314 through opening 316, according to an example embodiment.

Solderable metal layer feature 1302 includes one or more metal layers, with at least a top outer layer of solderable metal layer feature 1302 being a solderable metal layer. Layers of solderable metal layer feature 1302 may include one or more metals such as a solder or solder alloy, copper, aluminum, gold, silver, nickel, tin, titanium, a combination of metals/ alloy, etc. Furthermore, the layers of solderable metal layer feature 1302 may be stacked in any combination to provide various benefits. For example, a first combination of solderable metal layers in a first example stack for solderable metal layer feature 1302 may include a first Titanium layer, a second Nickel layer, and a third Silver layer (Ti/Ni/Ag), where the Titanium layer is the lowest layer, and the Silver layer is the outermost and most solderable layer of the stack. A second combination of solderable metal layers in a second example stack for solderable metal layer feature 1302 may include a first Aluminum layer, a second Nickel-Vanadium layer, and a third Copper layer (Al/NiV/Cu), where the Aluminum layer is the lowest layer, and the Copper layer is the outermost and most solderable layer of the stack. These example stacks are provided for purposes of illustration, and are not intended to be limiting. Solderable metal layer feature 1302 may include metals having the greatest solderability as the outermost layers, including Tin, Cadmium, Gold, Silver, Palladium, and/or Rhodium. The lowest layers of solderable metal layer feature 1302 may include metals that adhere well to electrical conductor 302 (which may include terminal 314), which may have an outermost aluminum layer or other metal layer. Intermediate metal layers of solderable metal layer features 1302 may be present to provide adhesion when transitioning from the lowest layer to the outermost layer, to provide protection for underlying metal or circuitry (e.g., electrical conductor 302 and/or terminal 314) from chemical/thermal/electrical interactions, etc.

Solderable metal layer features 1302 may be formed layer by layer in any manner, including by a sputtering process, a plating process, a printing process (e.g., ink jet printing), or other technique. By forming solderable metal layer feature 1302 on electrical conductors, a wafer bumping process (e.g., step 104 of flowchart 100 in FIG. 1) may be eliminated.

In embodiments, solderable metal layer features 1302 may have any size/area. For instance, in an embodiment, solderable metal layer features 1302 may cover a portion of the area of electrical conductor 302 that is accessible in opening 318 or a portion of the area of terminal 314 that is accessible in opening 316. In another embodiment, solderable metal layer features 1302 may cover the entire area of electrical conductor 302 that is accessible in opening 318 or the entire area of terminal 314 that is accessible in opening 316. In embodiments, solderable metal layer features 1302 may overlap with passivation layer 308 and/or passivation layer 310.

Figure 15:
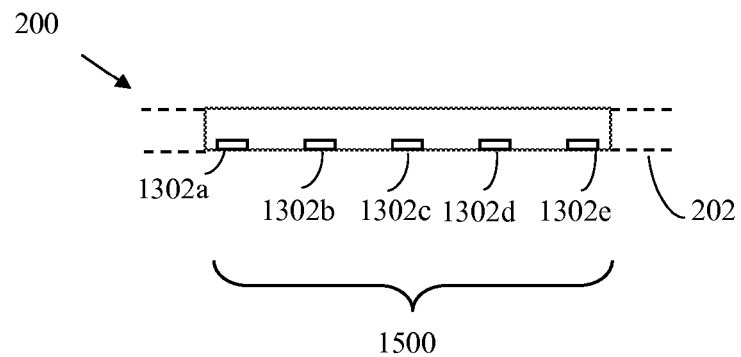
FIG. 15 shows a cross-sectional side view of a wafer that includes an integrated circuit region having solderable metal layer features, according to an example embodiment.
Figure 16:
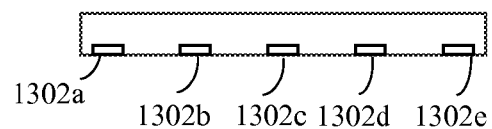
FIG. 16 shows a flip chip die separated from the wafer of FIG. 15, according to an example embodiment.

Referring back to FIG. 11, in step 1106, the wafer is separated into a plurality of separate flip chip dies. For instance, FIG. 15 shows a cross-sectional side view of wafer 200, highlighting an integrated circuit region 1500, according to an example embodiment. As shown in FIG. 15, integrated circuit region 1500 has a plurality of solderable metal layer features 1302a-1302e formed on surface 202 of wafer 200 on corresponding electrical conductors. Any number of solderable metal layer features 1302 may be formed in each integrated circuit region of wafer 200, including tens, hundreds, thousands, or other numbers of solderable metal layer features 1302. For instance, such solderable metal layer features 1302 may be formed in arrays corresponding to arrays of terminals of the corresponding integrated circuit regions. Wafer 200 of FIG. 15 may be singulated (separated) into a plurality of integrated circuit packages corresponding to the integrated circuit regions formed therein. For instance, FIG. 16 shows a flip chip die 1600, according to an example embodiment. Flip chip die 1600 corresponds to integrated circuit region 1500 after wafer 200 has been singulated into a plurality of flip chip dies similar to flip chip die 1600. Wafer 200 may be singulated in any manner, including using a saw, a laser, or other singulation technique, as would be known to persons skilled in the relevant art(s).

In step 1108, a plurality of package substrates is fabricated, each package substrate having a surface that includes an array of conductive features coated with solder. For example, as described above, FIG. 7 shows a portion of package substrate 700. In the example of FIG. 7, base substrate layer 702 of package substrate 700 has a first electrically conductive layer on surface 708. The first electrically conductive layer includes a plurality of conductive features (e.g., signal pads), including conductive features 704a and 704b. Furthermore, solder on pad (SOP) features 706a and 706b are formed on conductive features 704a and 704b, respectively. Solder on pad features 706a and 706b are solder finishes that are applied to conductive features 704a and 704b, such as by stencil printing or plating, as would be known to persons skilled in the relevant art(s). Solder on pad features 706a and 706b can be formed at any suitable location, including at a substrate assembly facility or at a package assembly facility. Package substrates 700 may be formed singly or in sheets or panels of package substrates 700 according to techniques that would be known to persons skilled in the relevant art(s).

Figure 17:
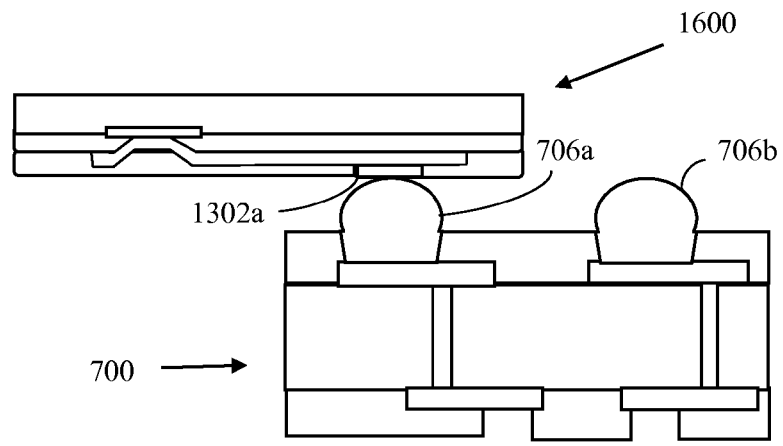
FIG. 17 shows a portion of a flip chip die mounted to the portion of the package substrate shown in FIG. 7, according to an example embodiment.

In step 1110, each flip chip die is mounted to a corresponding package substrate such that each solder coated pad is coupled to a corresponding solderable metal layer feature to form a plurality of flip chip packages. For instance, each integrated circuit flip chip die 1600 separated from wafer 200 in step 1106 may be mounted to a corresponding package substrate 700 to form a corresponding flip chip package. FIG. 17 shows a portion of flip chip die 1600 (FIG. 16) being mounted to the portion of package substrate 700 visible in FIG. 7, according to an example embodiment. As shown in FIG. 17, each solderable metal layer feature 1302 of flip chip die 1600 is positioned in contact with a corresponding SOP feature 706 of package substrate 700 (solderable metal layer feature 1302a is shown in contact with SOP feature 70ba). The solderable metal layer feature 1302 and SOP features 706 may be reflowed or otherwise processed to cause the contacting solderable metal layer feature 1302/SOP feature 706 pairs to melt and solidify together to form a solder bond or joint. An array of such solder bonds/joints are formed to attach flip chip die 1600 to package substrate 700, and to interface the signals of flip chip die 1600 with corresponding routing in package substrate 700.

Figure 18:
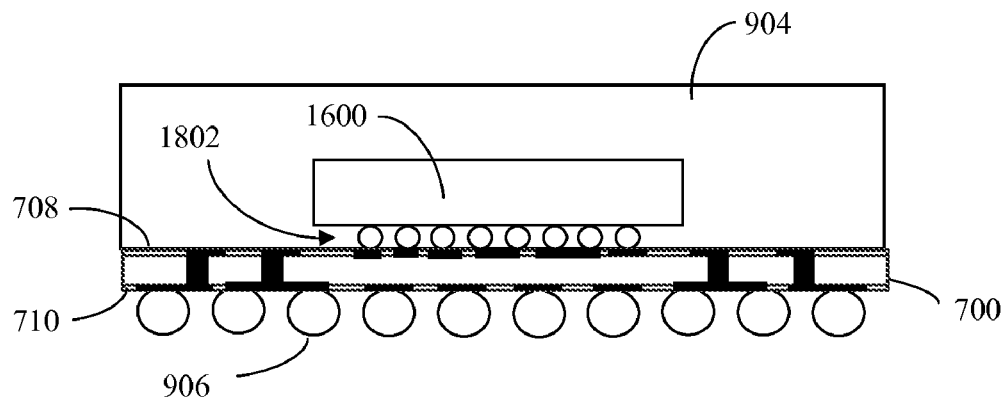
FIG. 18 shows a side view of a flip chip package formed by mounting the flip chip die of FIG. 16 to the package substrate of FIG. 17, according to an example embodiment.

For example, FIG. 18 shows a side view of a flip chip package 1800 formed by mounting flip chip die 1600 to package substrate 700, according to an example embodiment. As shown in FIG. 18, an array 1802 of solder bonds/joints formed by connected solderable metal layer features 1302 and SOP features 706 attaches flip chip die 1600 to package substrate 700. Note that further processing may be performed to assemble package 1800, including applying an encapsulating material 904 that encapsulates flip chip die 1600 on package substrate 700, attaching solder balls 906 to surface 710, etc. Note that flip chip dies 1600 may be mounted to package substrates 700 that are separate or that are included in sheets or panels of package substrates 700. The sheet-included package substrates 700, with mounted flip chip dies 1600, may subsequently be singulated. Encapsulating material 904 and/or solder balls 906 may be added to the separate package substrates 700 or to package substrates 700 when still included in sheets or panels.

As described above, flowchart 100 includes a relatively large number of assembly steps, and therefore is an expensive technique for assembling flip chip packages. Furthermore, flip chip package assembly system 1000 includes a wafer bumping facility 1006, because wafer bumping is typically performed at a facility that specializes in wafer bumping. Embodiments described herein provide less complex and less expensive techniques for assembling flip chip packages, because wafer bumping is not needed. For example, flowchart 1100 does not include a wafer bumping step, saving time and costs. Furthermore, systems for assembling flip chip packages may be configured that include fewer assembly apparatuses/systems and/or facilities relative to system 1000 of FIG. 10, according to embodiments.

Figure 19:
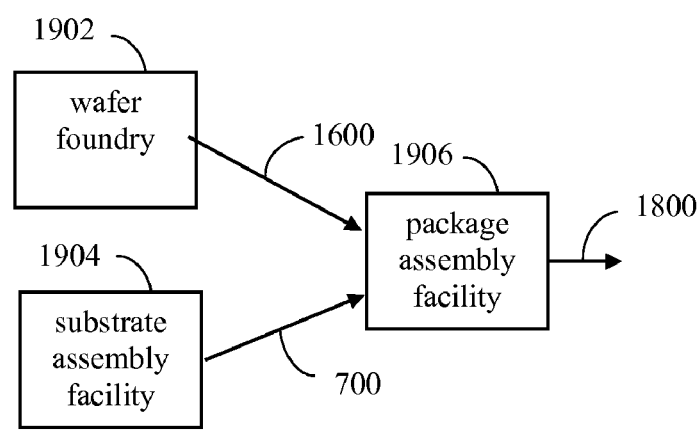
FIG. 19 shows a block diagram of an example package assembly system, according to an example embodiment.

For instance, FIG. 19 shows a block diagram of an example package assembly system 1900, according to an example embodiment. Package assembly system 1900 may be used to assemble flip chip packages 1800, for example. As shown in FIG. 19, system 1900 includes a wafer foundry 1902, a substrate assembly facility 1904, and a package assembly facility 1906. Wafer fabrication according to step 1102 of flowchart 1100 (FIG. 11) is typically performed at wafer foundry 1902. Wafer foundry 1902 produces wafer 200. Furthermore, wafer foundry 1902 may form solderable metal layer features 1302 on the accessible electrical conductors of wafer 200 according to step 1104 of flowchart 1100. Wafer foundry 1902 may optionally singulate wafer 200 into separate flip chip dies 1600 (according to step 1106 of flowchart 1100), which are provided to package assembly facility 1906 as shown in FIG. 19. Alternatively, wafer 200 (with solderable metal layer features 1302) may be provided to package assembly facility 1906, and package assembly facility 1906 may singulate wafer 200 into separate flip chip dies 1600. A substrate supplier at substrate assembly facility 1904 produces substrates for flip chip packages according to step 1108 of flowchart 1100. As shown in FIG. 19, package assembly facility 1906 receives package substrates 700 from substrate assembly facility 1904. Package assembly facility 1906 attaches received flip chip dies 1600 to package substrates 700 to assemble flip chip packages 1800 according to step 1110.

Thus, as shown in FIG. 19, relative to system 1000 of FIG. 10, system 1900 does not include wafer bumping facility 1006, reducing costs (e.g., transportation costs, UBM and wafer bumping costs, etc.) and providing a less complex package assembly system. As described herein, embodiments have advantages over conventional techniques. For example, the wafer bumping process is eliminated, and thus no solder bump interconnects or UBM layers need be formed on wafers. The overall assembly process flow is simplified, with reduced logistics. Because wafer bumping is not included in the process flow, a wafer bumping supplier/facility is not involved. Cycle times for package assembly are reduced due to the elimination of wafer bumping. For instance, in some cases, the cycle time may be reduced by about one week. The processes that are used to produce solderable metal layer features 1302 and the SOP fabrication processes used to produce SOP features 706 do not introduce significant extra cycle time. Costs are lowered due to the elimination of the wafer bumping process. Resulting package reliability is comparable to reliability of packages assembled according to conventional techniques. Furthermore, package assembly according to embodiments is relatively low risk because mature technologies may be used.

For instance, in one embodiment, a sputtering process is used in step 1104 to sputter solderable metal layers 1302 on the wafer at wafer foundry 1002 after an AP layer is formed on the electrical conductor. In this manner, the UBM process performed at a bumping house can be eliminated. Because the substrate supplier can add SOP features 706 to package substrates 700, and in some cases SOP features need to be added to package substrates 700 for other package aspects anyway, an SOP process can be used to replace the solder bump application at the bumping facility without introducing additional inefficiencies. The sputtering process that may be used to generate solderable metal layers 1302 and the SOP process for forming SOP features 706 are mature processes. Thus, there is little to no risk in replacing the wafer bumping process. The wafer bumping supplier can be eliminated from the supplier chain.

In embodiments, any number of integrated circuit packages may be formed without wafer bumping as described herein, including single packages as well as multiple packages formed in parallel. For instance, flowchart 1100 describes the assembly of a plurality of integrated circuit packages in parallel. Flowchart 1100 may be modified in various ways for the assembly of a single integrated circuit package. For example, FIG. 20 shows a flowchart 2000 providing an example process for assembling an integrated circuit package, according to an embodiment. Any number of integrated circuit packages may be formed according to flowchart 2000. Flowchart 2000 is described as follows.

In step 2002, an integrated circuit die is received, the die including a surface having a passivation layer formed thereon such that a portion of each of a plurality of electrical conductors is accessible through a corresponding opening of a plurality of openings in the passivation layer. For example, FIG.

16 shows a flip chip die 1600 that may be received. Flip chip die 1600 has a surface that includes one or more electrical conductors (e.g., electrical conductor 302 of FIG. 3 and/or terminal 314 of FIG. 12) that are accessible through respective openings.

In step 2004, a plurality of solderable metal layer features is formed on the plurality of electrical conductors through the openings such that each solderable metal layer feature is formed on the accessible portion of a respective electrical conductor of the plurality of electrical conductors. For example, as shown in FIG. 13, solderable metal layer feature 1302 is formed on electrical conductor 302, and in the example of FIG. 14, solderable metal layer feature 1302 is formed on terminal 314. As shown in FIG. 16, flip chip die 1300 may include an array of solderable metal layer features 1302 (e.g., solderable metal layer features 1302a-1302e) formed on corresponding electrical conductors.

In step 2006, the integrated circuit die is mounted to a package substrate such that each SOP feature of a plurality of solder on pad (SOP) features on a surface of the package substrate is coupled to a corresponding solderable metal layer feature. For example, as shown in FIG. 17, flip chip die 1600 is mounted to package substrate 700 such that solderable metal layer feature 1302a and SOP feature 706a join to form a solder bond. FIG. 18 shows a view of flip chip package 1800 formed by mounting flip chip die 1600 to package substrate 700. As shown in FIG. 18, an array 1802 of solder bonds/joints may be formed by connected solderable metal layer features 1302 and SOP features 706 to mount flip chip die 1600 to package substrate 700.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
   receiving a wafer having a surface defined by a plurality of integrated circuit regions, the surface of the wafer having a first passivation layer formed thereon such that a portion of each of a plurality of electrical conductors is accessible through a corresponding opening of a plurality of first openings in the first passivation layer in each integrated circuit region,
   wherein each integrated circuit region has a second passivation layer and a plurality of terminals on the surface of the wafer accessible through a plurality of second openings in the second passivation layer, each electrical conductor having a first portion in contact with a respective terminal of the plurality of terminals and a second portion that extends over the second passivation layer, the first passivation layer being formed over the second passivation layer and the plurality of electrical conductors, the first passivation layer having the first openings that each expose a second portion of a respective electrical conductor;
   forming a plurality of solderable metal layer features on the plurality of electrical conductors through the first openings such that each solderable metal layer feature is formed on the accessible portion of a respective electrical conductor of the plurality of electrical conductors;
   singulating the wafer to form a plurality of flip chip dies that each include at least one integrated circuit region of the plurality of integrated circuit region; and
   mounting each flip chip die of the plurality of flip chip dies to a corresponding package substrate of a plurality of package substrates, each package substrate having a plurality of solder on pad (SOP) features on a respective surface, each flip chip die mounted to a corresponding package substrate such that each SOP feature is coupled to a corresponding solderable metal layer feature.

2. The method of claim 1, wherein said forming comprises:
   ink jet printing the plurality of solderable metal layer features on the plurality of electrical conductors.

3. The method of claim 1, wherein said forming comprises:
   sputtering the plurality of solderable metal layer features on the plurality of electrical conductors.

4. The method of claim 1, wherein said forming comprises:
   forming a stack of metal layers on each of the plurality of electrical conductors through the first openings.

5. A method, comprising:
   receiving an integrated circuit die, a surface of the integrated circuit die having a first passivation layer formed thereon such that a portion of each electrical conductor of a plurality of electrical conductors is accessible through a corresponding opening of a plurality of first openings in the first passivation layer;
   forming a plurality of solderable metal layer features on the plurality of electrical conductors through the plurality of first openings such that each solderable metal layer feature of the plurality of solderable metal layer features is formed on the an accessible portion of a respective electrical conductor of the plurality of electrical conductors; and
   mounting the integrated circuit die to a package substrate such that each solder on pad (SOP) feature of a plurality of SOP features on a surface of the package substrate is coupled to a corresponding solderable metal layer feature of the plurality of solderable metal layer features,
   wherein the integrated circuit die has a second passivation layer and a plurality of terminals on the surface of the integrated circuit die accessible through a plurality of second openings in the second passivation layer, the each electrical conductor having a first portion in contact with a respective terminal of the plurality of terminals and a second portion that extends over the second passivation layer, the first passivation layer being formed over the second passivation layer and the plurality of electrical conductors, the first passivation layer having the plurality of first openings that each expose the second portion of the respective electrical conductor, and
   wherein said forming comprises forming the plurality of solderable metal layer features on the plurality of electrical conductors such that the each solderable metal layer feature is formed on the exposed second portion of the respective electrical conductor.

6. The method of claim 5, wherein said forming comprises:
   ink jet printing the plurality of solderable metal layer features on the plurality of electrical conductors.

7. The method of claim 5, wherein said forming comprises:
   sputtering the plurality of solderable metal layer features on the plurality of electrical conductors.

8. The method of claim 5, wherein said forming comprises:
   forming a stack of metal layers on each of the plurality of electrical conductors through the first openings.

* * * * *